United States Patent
Stockinger et al.

(10) Patent No.: US 12,034,000 B2
(45) Date of Patent: Jul. 9, 2024

(54) DOUBLE IO PAD CELL INCLUDING ELECTROSTATIC DISCHARGE PROTECTION SCHEME WITH REDUCED LATCH-UP RISK

(71) Applicant: NXP B.V., Eindhoven (NL)

(72) Inventors: Michael A. Stockinger, Austin, TX (US); Mohamed Suleman Moosa, Austin, TX (US)

(73) Assignee: NXP B.V., Eindhoven (NL)

( * ) Notice: Subject to any disclaimer, the term of this patent is extended or adjusted under 35 U.S.C. 154(b) by 192 days.

(21) Appl. No.: 17/702,588

(22) Filed: Mar. 23, 2022

(65) Prior Publication Data

US 2023/0307440 A1 Sep. 28, 2023

(51) Int. Cl.
*H01L 27/02* (2006.01)
*H02H 9/04* (2006.01)

(52) U.S. Cl.
CPC ...... *H01L 27/0292* (2013.01); *H01L 27/0255* (2013.01); *H01L 27/0296* (2013.01); *H02H 9/046* (2013.01)

(58) Field of Classification Search
CPC ............. H01L 27/0292; H01L 27/0255; H01L 27/0296; H02H 9/046
USPC ......................................................... 361/56
See application file for complete search history.

(56) References Cited

U.S. PATENT DOCUMENTS

| | | | |
|---|---|---|---|
| 6,657,264 B2 | 12/2003 | Cho et al. | |
| 7,280,329 B2 | 10/2007 | Kim et al. | |
| 7,446,990 B2 * | 11/2008 | Miller | H01L 27/0251 361/56 |
| 7,579,632 B2 * | 8/2009 | Salih | H01L 23/60 438/983 |
| 7,777,998 B2 * | 8/2010 | Stockinger | H01L 27/0292 361/111 |
| 8,995,101 B2 * | 3/2015 | Demange | H01L 27/0285 361/91.1 |
| 9,236,372 B2 * | 1/2016 | Stockinger | H01L 27/0255 |
| 9,607,976 B2 * | 3/2017 | Nakaiso | H01L 23/485 |
| 11,276,688 B2 | 3/2022 | Shukla et al. | |
| 2002/0130390 A1 * | 9/2002 | Ker | H01L 29/8611 257/E29.328 |
| 2004/0027742 A1 * | 2/2004 | Miller | H01L 27/0251 361/111 |

(Continued)

FOREIGN PATENT DOCUMENTS

WO WO-2005039011 A1 * 4/2005 ......... H01L 27/0251

*Primary Examiner* — Dharti H Patel

(57) ABSTRACT

A double IO pad cell including a busing frame formed on a busing metal layer aligned with a same-sized component frame integrated on a component layer of an IC. The busing frame includes first and second IO pads, a supply voltage rail, and a ground voltage rail. The component frame includes first and second primary ESD circuitry each including a first diode coupled between a respective one of the first and second IO pads and the supply voltage rail and a second diode coupled between the respective IO pad and the ground voltage rail. The second diodes of each primary ESD circuitry are integrated adjacent each other sandwiched between the first diodes which act as collector guard bands for the second diodes. The diodes of each primary ESD circuitry of the component frame are aligned with a corresponding one of the first and second IO pads of the busing frame.

20 Claims, 6 Drawing Sheets

(56) References Cited

U.S. PATENT DOCUMENTS

| | | | |
|---|---|---|---|
| 2005/0078419 A1* | 4/2005 | Stockinger | H01L 27/0292 361/56 |
| 2009/0067104 A1* | 3/2009 | Stockinger | H01L 27/0251 361/56 |
| 2011/0051299 A1* | 3/2011 | Hiraoka | H01L 27/0255 361/56 |
| 2012/0014024 A1* | 1/2012 | Tailliet | G01R 1/00 361/91.1 |
| 2012/0275074 A1* | 11/2012 | Dill | H01F 27/2804 336/192 |
| 2014/0198416 A1* | 7/2014 | Karp | H02H 9/044 257/360 |
| 2015/0070803 A1* | 3/2015 | Youssef | H03F 1/223 361/56 |
| 2016/0126729 A1* | 5/2016 | Gerdemann | H02H 9/046 361/56 |
| 2018/0109105 A1* | 4/2018 | Lin | H01L 27/0248 |
| 2020/0219867 A1* | 7/2020 | Grad | H04L 25/0272 |

\* cited by examiner

DOUBLE IO PAD CELL INCLUDING ELECTROSTATIC DISCHARGE PROTECTION SCHEME WITH REDUCED LATCH-UP RISK

BACKGROUND

Field of the Invention

The present disclosure relates in general to electrostatic discharge (ESD) protection, and more specifically to a compact double input-output (IO) pad cell including a dual-diode ESD protection scheme for two analog signals that reduces latch-up risk for nearby victim structures and that optimizes pad cell and ESD diode aspect ratios to minimize overall cell area and the effective ESD diode strapping resistance.

Description of the Related Art

External pins for analog signals typically require electrostatic discharge (ESD) protection. A dual-diode ESD protection scheme is known for advanced complementary metal-oxide semiconductor (CMOS) technologies along with ESD rail clamps to protect supply and ground rails. A conventional analog input-output (IO) pad cell floor plan includes a single analog IO pad, a pair of ESD diodes and a secondary ESD block as the only cell elements. The aspect ratio of the conventional IO pad cell wastes significant cell area for vertical guard rings along the boundaries of the cell. In the conventional IO pad cell, the ESD diodes are relatively tall, which requires that the analog metal IO pad be quite tall to overlap about half of the diodes in which the other halves are covered by the corresponding supply buses. This reduces the effective metal width of the supply buses and hence the effectiveness of remote ESD rail clamps. The tall shape of the ESD diodes also makes for relatively long vertical diode metal straps, which adds even more series resistance to the ESD path. One of the ESD diodes has an N+ active region formed within a P-type well (PW), which represents a strong electron injector (n-Emitter) located relatively close to the top boundary of the conventional IO pad cell. The injected electrons can induce latch-up in nearby victim structures, such as nearby MOSFETs and their parasitic silicon-controlled rectifiers (SCRs) and the like.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A double input-output (IO) pad cell as described herein provides an electrostatic discharge (ESD) protection scheme for two external signals. The ESD protection scheme includes two diodes (dual diode) for each of two IO pads of the two external signals, in which the diodes are positioned so that N-wells of P+/NW diodes act as collector guard bands for the corresponding N+/PW diodes. This scheme reduces latch-up risk for nearby victim structures. The double IO pad furthermore optimizes the aspect ratios of the pad cell as well as of the ESD diodes, which minimizes the overall cell area and the effective ESD diode strapping resistance.

Figure 1:
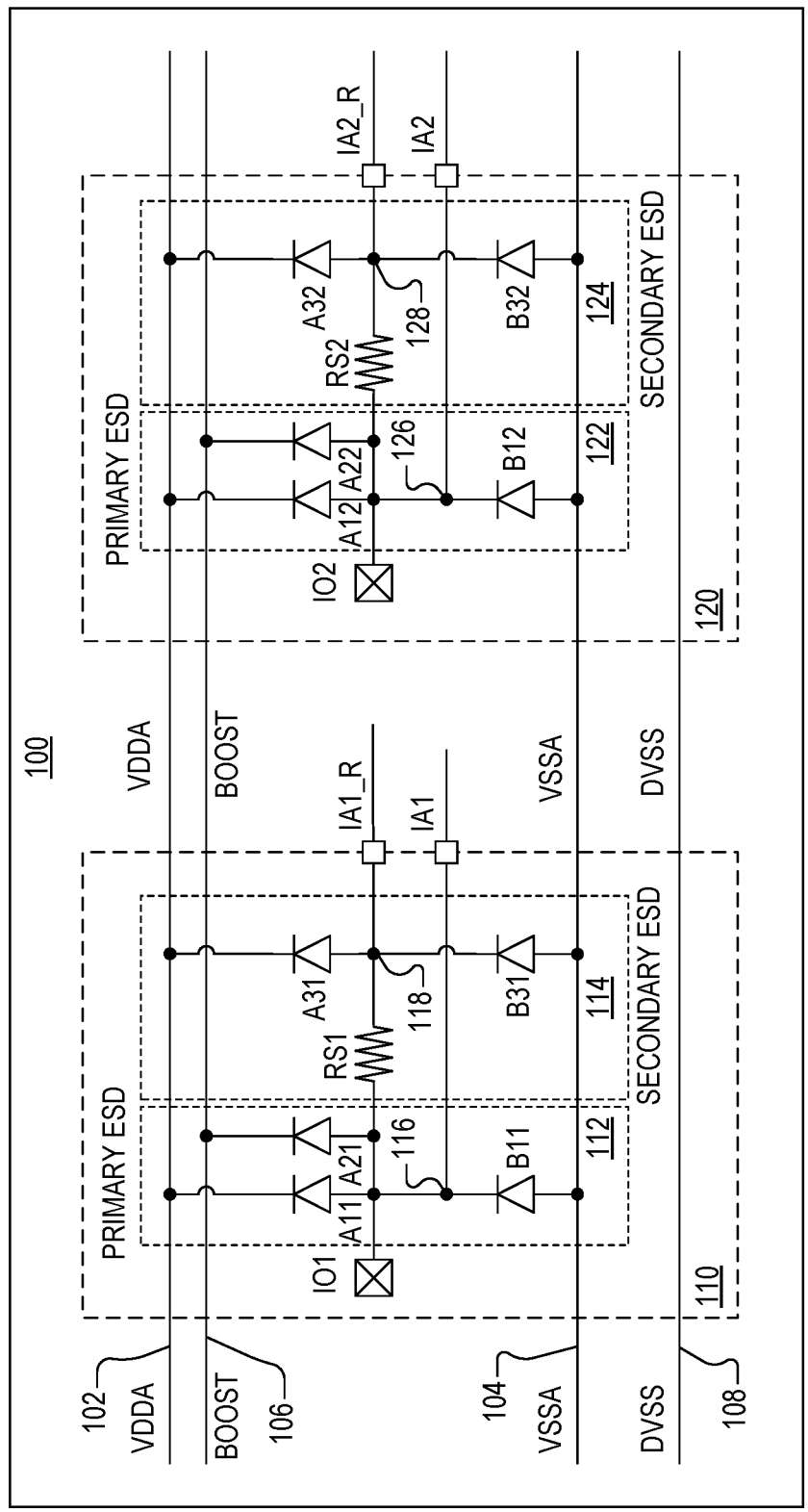
FIG. 1 is a schematic diagram of an integrated circuit (IC) incorporating a dual-diode electrostatic discharge (ESD) protection scheme for a pair of analog input-output (IO) pins IO1 and IO2 according to one embodiment of the present disclosure.

FIG. 1 is a schematic diagram of an integrated circuit (IC) 100 incorporating a dual-diode electrostatic discharge (ESD) protection scheme for a pair of analog input-output (IO) pins IO1 and IO2 according to one embodiment of the present disclosure. Each of the IO pins IO1 and IO2 are provided for electrically conveying a corresponding pair of external analog IO signals. Each of the external analog IO signals may be an input signal, an output signal, or a combination of both input and output. A supply voltage (VDDA) rail IO2 develops an analog supply voltage VDDA, a ground voltage (VSSA) rail 104 develops an analog ground voltage VSSA, a boost rail 106 develops a BOOST voltage for powering ESD circuitry as further described herein, and a digital ground voltage (DVSS) rail 108 develops a global digital ground voltage DVSS for the IC 100. In one embodiment, the DVSS rail 108 may be connected to a P-type substrate 502 (see FIG. 5) of IC 100, and the VSSA rail 104 may be coupled to the DVSS rail 108 via additional ESD protection devices (not shown) providing a bi-directional ESD conduction path between these two ground rails. Such bi-directional ESD devices may, for example, include a pair of anti-parallel diodes where each diode is structurally similar to ESD diodes B11 or B12 shown in FIG. 1.

The illustrated ESD protection scheme includes a first dual-diode ESD protection circuit 110 for the IO1 pin and a second dual-diode ESD protection circuit 120 for the IO2 pin. Each of the ESD protection circuits 110 and 120 are configured in substantially similar manner in which each includes both primary and secondary ESD circuitry. As shown, the ESD protection circuit 110 includes a primary ESD circuit 112 and a secondary ESD circuit 114. The primary ESD circuit 112 includes diodes A11, B11, and A21. A11 and A21 each have an anode coupled to an internal node 116 which is further electrically connected to the IO1 pin in any suitable manner depending upon the particular implementation. A11 has a cathode coupled to VDDA and A21 has a cathode coupled to BOOST. B11 has an anode coupled to VSSA and a cathode coupled to node 116. The secondary ESD circuit 114 includes diodes A31 and B31 and a series resistor RS1 coupled between node 116 and another internal node 118. A31 has an anode coupled to node 118 and a cathode coupled to VDDA, and B31 has an anode coupled to VSSA and a cathode coupled to node 118. Node 116 develops an internal signal IA1 and node 118 develops an internal signal IA1_R. Internal circuitry of the IC 100 is not further described.

In a similar manner, the ESD protection circuit 120 includes a primary ESD circuit 122 and secondary ESD circuit 124. The primary ESD circuit 122 includes diodes A12, A22, and B12. A12 and A22 each have an anode coupled to an internal node 126 which is further coupled to the IO2 pin. A12 has a cathode coupled to VDDA and A22 has a cathode coupled to BOOST. B12 has an anode coupled to VSSA and a cathode coupled to node 126. The secondary ESD circuit 124 includes diodes A32 and B32 and a series resistor RS2 coupled between node 126 and another internal node 128. A32 has an anode coupled to node 128 and a cathode coupled to VDDA, and B32 has an anode coupled to VSSA and a cathode coupled to node 128. Node 126 develops an internal signal IA2 and node 128 develops an internal signal IA2_R.

Operation of each of the ESD protection circuits 110 and 120 is only briefly described using simplified notation, in which A1 represents either A11 or A12, B1 represents either B11 or B12, A2 represents either A21 or A22, RS represents either RS1 or RS2, IA represents either IA1 or IA2, and IA_R represents either IA1_R or IA2_R. This simplified notation may be used throughout this description since structure and operation of the ESD protection circuits 110 and 120 are substantially the same. In response to an ESD event on the IO pin, the A1 diode clamps the IO pin to VDDA during positive ESD current injection, or the B1 diode clamps the IO pin to VSSA during negative ESD current injection. The secondary ESD circuit operates in a similar manner via series resistance RS. The secondary ESD circuit further reduces the stress voltage on the IA_R node as compared to the node IA. The stress voltage reduction is equivalent to the voltage drop across the resistor RS during an ESD event. A2 empowers the BOOST rail 106 which activates trigger circuitry (not shown), and the trigger circuitry activates ESD protection circuitry for clamping the voltage level across VDDA and VSSA, such as, for example, distributed ESD clamps 602 shown in FIG. 6.

Figure 2:
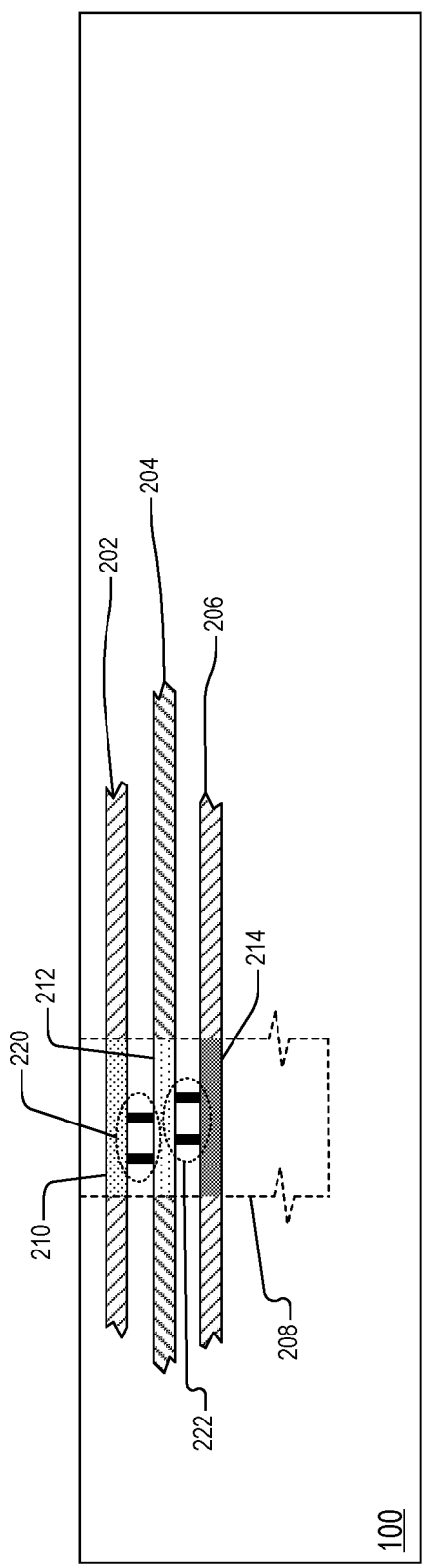
FIG. 2 is a simplified side view of the IC of FIG. 1 with various layers and an exemplary double IO pad cell traversing multiple layers of the IC while incorporating the dual-diode ESD protection scheme shown in FIG. 1.

FIG. 2 is a simplified side view of the IC 100 illustrating relative locations of various layers and an exemplary double IO pad cell 208 traversing multiple layers of the IC 100 while incorporating the dual-diode ESD protection scheme shown in FIG. 1. The IC 100 and the illustrated layers are not shown to scale and are not intended to be depicted as cross-sectional views, and additional layers may be included but are not shown. Instead, FIG. 2 is provided to illustrate that the double IO pad cell 208 incorporates aligned portions of the various layers. Although FIG. 2 depicts a length of the double IO pad cell 208 (from left to right), it is understood that the double IO pad cell 208 has a corresponding height (not shown) in the horizontal orthogonal direction of the IC 100 (i.e., traversing into and out of the Figure page). The various layers of the IC 100 may include multiple metal layers including a "vertical" bus strapping layer 202 and a "horizontal" busing layer 204. The terms "vertical" and "horizontal" indicate that strips of metal forming portions of voltage rails on the respective layers are orthogonally oriented with respect to each other. The bus strapping layer 202 may be a top copper metal interconnect layer used for vertical bus strapping and for providing connectivity to upper layers (not shown), such as an aluminum or redistribution layer above the bus strapping layer 202 used to connect to bumps or the like on the semiconductor die of the IC 100. The busing layer 204 may be a second (or next lower) copper metal layer used for a horizontal busing scheme and the like. A component layer 206 is another lower or embedded layer of the IC 100 for integrated various electrical components including, for example, the components of the dual-diode ESD protection circuits 110 and 120.

A dashed line delineates those portions of the various layers contained within or otherwise forming the double IO pad cell 208, which may extend at any suitable depth from a top surface of the IC 100. That portion of the bus strapping layer 202 that is contained within or otherwise aligned with the double IO pad cell 208 is a corresponding strapping frame 210 for the double IO pad cell 208, that portion of the busing layer 204 that is contained within or otherwise aligned with the double IO pad cell 208 is a corresponding busing frame 212, and that portion of the component layer 206 that contains the components of the dual-diode ESD protection circuits 110 and 120 of the double IO pad cell 208 is an ESD component frame 214.

Conductive vias are typically provided between the various layers for electrically connecting corresponding voltage rails and electrical components. As shown, for example, multiple conductive vias 220 may be provided between the strapping frame 210 and the busing frame 212 for electrically coupling corresponding voltage rails and electrical components of those frames. Only two conductive vias 220 are shown to represent that any number of conductive vias may be provided between the respective frames. Also, the depicted vias 220 are shown in simplified manner and not intended to represent any particular size, shape, or scale. In addition, multiple conductive vias 222 are shown provided between the busing frame 212 and the ESD component frame 214 for electrically coupling corresponding voltage rails and electrical components of those frames. Again, only two conductive vias 222 are shown to represent that any number of conductive vias may be provided between the respective frames. Also, the depicted vias 222 are shown in simplified manner and not intended to represent any particular size, shape, or scale. It is appreciated that other layers (not shown) may be positioned between the illustrated layers, in which the conductive vias 220 and 222 may be implemented as a multidimensional matrix of vias for electrically coupling corresponding voltage rails and components. Additional layers and corresponding details are not shown as not necessary for a complete understanding of embodiments described herein.

Figure 3:
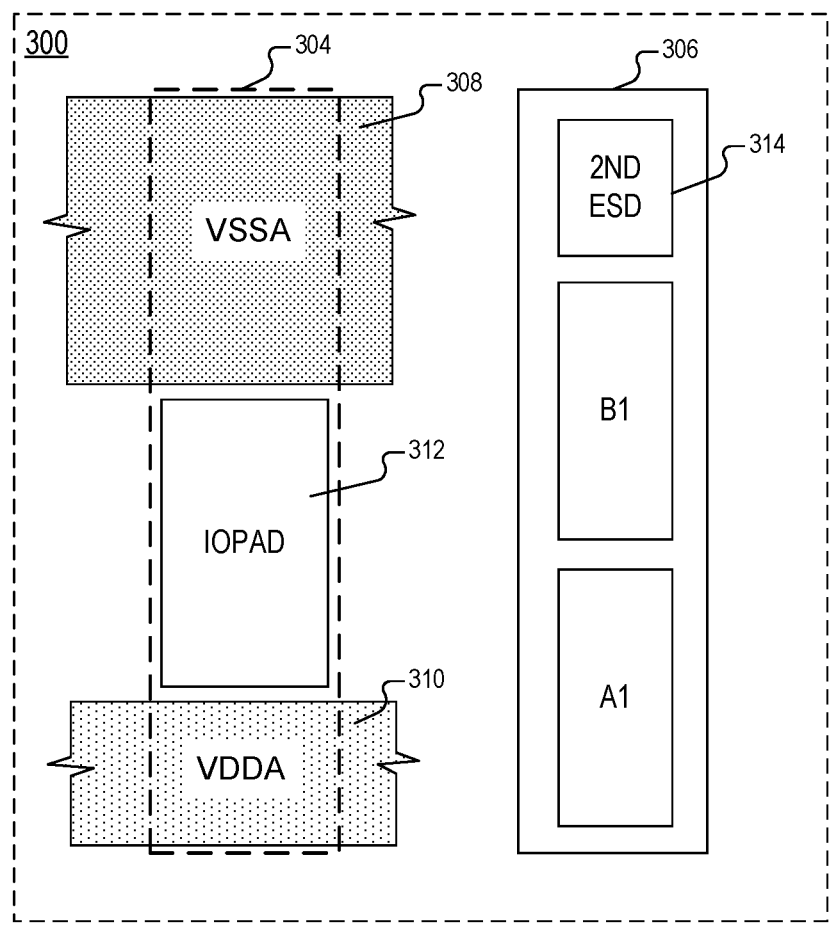
FIG. 3 is a simplified diagram of top views of a busing frame and a floor plan of an ESD component frame of a conventional IO pad cell.

FIG. 3 is a simplified diagram of top views of a busing frame 304 and a floor plan of an ESD component frame 306 of a conventional IO pad cell 300. The length of the frames 304 and 306 are depicted in the horizontal direction (left to right of page) and the frame heights are depicted in the vertical direction (top to bottom of page). If implemented on an IC having a similar layer structure as the IC 100, for example, the busing frame 304 would be formed within a corresponding busing frame of a busing layer (similar to the busing frame 212 of the busing layer 204), and the ESD component frame 306 would be the ESD component frame formed on a corresponding component layer (similar to the ESD component frame 214 of the component layer 206). Thus, the component frame 306 is aligned with the busing frame 304 within the IC albeit on different layers. The corresponding strapping scheme is not shown.

The illustrated busing frame 304 shows a portion of a VSSA rail 308 and a portion of a VDDA rail 310, both of which extend beyond the frame extents of the IO pad cell 300 along the corresponding metal layer of the IC in which it is fabricated. It is noted that additional rails may be included but are not shown, such as, for example, a DVSS rail. The busing frame 304 further shows a single IO pad 312 which is electrically coupled to the corresponding external pin of the IC in which it is fabricated (not shown). The floor plan of the ESD component frame 306 includes the A1 and B1 diodes of the primary ESD scheme of the conventional ESD configuration, along with a secondary ESD block 314 for incorporating the secondary ESD components, such as additional secondary diodes A3 and B3 and series resistor similar to that shown for either the ESD protection circuits 110 or 120.

Although not specifically shown, it is understood that diode A1 includes an anode coupled to the IO pad 312 and a cathode coupled to the VDDA rail 310, diode B1 includes an anode coupled to the VSSA rail 308 and a cathode coupled to the IO pad 312, and the secondary ESD components contained within the secondary ESD block 314 are coupled to the VSSA and VDDA rails 308 and 310 and the IO pad 312 in a similar manner as shown for the ESD protection circuits 110 and 120.

Such electrical connections are typically achieved using conductive vias between the various layers of the IC in which it is fabricated. In this manner, the IC includes a dual-diode ESD protection scheme for the IO pad 312. An ESD rail clamp (not shown) may also be provided as part of another cell type to protect VDDA to VSSA.

Due to the ESD diodes A1 and B1 and the secondary ESD block 314 being the only cell elements, the aspect ratio of the pad cell, being relatively tall and narrow, wastes a significant amount of cell area for vertical guard rings (not shown) along the left and right cell boundaries. In this conventional IO pad cell 300, the ESD diodes A1 and B1 are relatively tall. This requires the IO pad 312 to be quite tall in order to overlap about half of the ESD diodes A1 and B1 when aligned in the different layers of the conventional IO pad cell 300. The remaining halves of the ESD diodes A1 and B1 are covered by the corresponding VDDA and VSSA supply rails 318 and 308. A roughly equal overlap of an ESD diode with the IO pad and the associated supply rail is desired to balance the connection resistances. The relatively tall IO pad reduces the effective metal width of the supply buses and hence the effectiveness of the remote ESD clamps. The tall shape of the A1 and B1 diodes also makes for relatively long vertical diode finger metal straps, which add even more series resistance to the ESD path. In addition, the B1 diode, which is configured with N+ active region formed within a P-type well (PW), implements a strong electron injector (n-Emitter) located relatively close to the top boundary of the conventional IO pad cell 300. The injected electrons can induce latch-up in nearby victim structures (not shown), such as nearby MOSFETs and their parasitic silicon-controlled rectifiers (SCRs) and the like.

Figure 4:
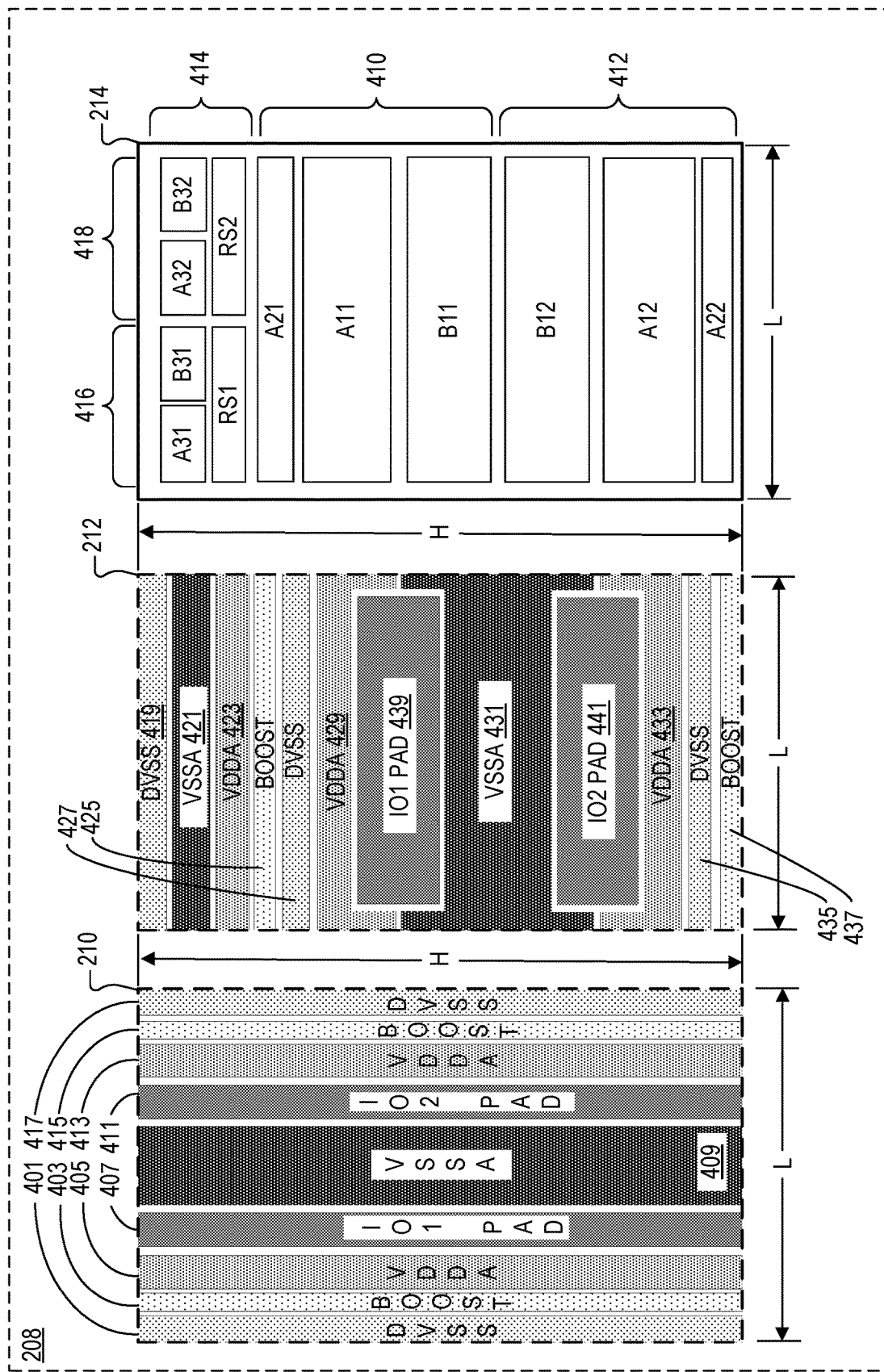
FIG. 4 is a simplified diagram of top views of the strapping frame, the busing frame, and a floor plan of the ESD component frame of the double IO pad cell implemented on the corresponding layers of the IC of FIG. 2 according to an embodiment of the present disclosure.

FIG. 4 is a simplified diagram of top views of the strapping frame 210, the busing frame 212, and a floor plan of the ESD component frame 214 of the double IO pad cell 208 implemented on the corresponding layers of the IC 100 according to an embodiment of the present disclosure. Each of the frames 210, 212, and 214 has a specified length L depicted in the horizontal direction (left to right of page) and a specified height H depicted in the vertical direction (top to bottom of page), so that each has substantially the same size (L×H). Since the frames 210, 212, and 214 are aligned with each other when fabricated on the IC 100, corresponding portions of each of the frames are also aligned with each other. The strapping frame 210 includes divided conductive strips of the VDDA rail 102, the VSSA rail 104, the BOOST rail 106, and the DVSS rail 108 vertically striped across the strapping frame 210 with various widths. It is understood that each of the conductive strips extend in both vertical directions.

Beginning on the left, the strapping frame 210 includes a narrow DVSS strip 401, a narrow BOOST strip 403, a wide VDDA strip 405, and a wide IO1 pad strip 407 that is electrically coupled to the IO pin IO1 and to an IO1 pad 439 of the busing frame 212. A wide VSSA strip 409 is centered in the strapping frame 210. Continuing from the center after the VSSA strip 409, the strapping frame 210 includes a wide IO2 pad strip 411 that is electrically coupled to the IO pin IO2 and to an IO2 pad 441 of the busing frame 212, another wide VDDA strip 413, another narrow BOOST strip 415, and a final narrow DVSS strip 417 on right-most side. The metal strips of the strapping frame 210 are essentially mirrored on either side of the center VSSA strip 409 except for the IO1 and IO2 pads, which are of similar connection type.

The floor plan of the ESD component frame 214 of the double IO pad cell 208 includes the components of both the first dual-diode ESD protection circuit 110 for the IO1 pin and corresponding IO1 pad 439 and the second dual-diode ESD protection circuit 120 for the IO2 pin and corresponding IO2 pad 441 to form a compact double IO pad cell. Thus, the ESD component frame 214 includes the diodes A11, A12, A21, A22, B11, and B12 of both the primary ESD circuit 112 and the primary ESD circuit 122. In addition, the ESD component frame 214 includes the diodes A31 and B31 and the resistor RS1 of the secondary ESD circuit 114, and the diodes A32, and B32 and the resistor RS2 of the secondary ESD circuit 124.

The larger diodes A11 and B11 and the somewhat smaller diode A21 of the primary ESD circuit 112 of the ESD protection circuit 110 are integrated within an area 410 of the ESD component frame 214, each being configured shorter and longer (or wider) as compared to prior conventional configurations. B11 is positioned at about the center of the area of the ESD component frame 214, A11 is positioned just above B11, and A21 is positioned just above A11 in the area 410. The larger diodes A12 and B12 and the somewhat smaller diode A22 of the primary ESD circuit 112 of the ESD protection circuit 120 are integrated within an area 412 extending from about the bottom to just below area 410 of the ESD component frame 214, again each being configured shorter and longer. B12 is positioned just below B11, A12 is positioned just below B12, and A22 is positioned just below A12 in the area 412. Each of the diodes A11, B11, A21, A12, B12, and A22 have lengths that extend almost the entire length of the ESD component frame 214 of the double IO pad cell 208.

It is noted that the B11 and B12 diodes, which are configured as N+/PW diodes as further described herein, are sandwiched between the A11 and A12 diodes, which are configured as P+/NW diodes as further described herein. In this manner, the N-wells of the A11 and A12 diodes create collector guard bands for the B11 and B12 diodes. These collector guard bands of the A11 and A12 diodes absorb electrons injected by the B11 and B12 diodes thereby reducing latch-up risk of any nearby victim circuits during ESD events.

The smaller components of the secondary ESD circuitries 114 and 124 are integrated within an area 414 at the upper end of the ESD component frame 214. The area 414 is divided into a first area 416 containing A31, B31 and RS1 of the secondary ESD circuit 114, and a second area 418 containing A32, B31 and RS2 of the secondary ESD circuit 124. Although the first area 416 is shown on the left side and the area 418 is shown on the right, the components in these areas may be swapped or even rearranged without modifying functional operation.

The busing frame 212 includes divided conductive strips of the VDDA rail 102, the VSSA rail 104, the BOOST rail 106, and the DVSS rail 108 horizontally striped across the busing frame 212 with various widths (or "heights"). It is understood that each of the conductive strips extend beyond the extent of the bus frame 404 of the double IO pad cell 208 in either horizontal direction of the busing layer 204 of the IC 100. On the top side in order from the top, the busing frame 212 includes a narrow DVSS strip 419, a wider VSSA strip 421, a wider VDDA strip 423, a narrow BOOST strip 425, a narrow DVSS strip 427, an even wider VDDA strip 429, a very wide VSSA strip 431, another wider VDDA strip 433, a narrow DVSS strip 435, and a final narrow BOOST strip 437 at the bottom of the busing frame 212. A rectangular portion of each of the VDDA strip 429 and the VSSA strip 431 are cut out at their intersection providing an intermediate rectangular space for the IO1 pad 439. In a similar manner, a rectangular portion of each of the VDDA strip 433 and the VSSA strip 431 are cut out at their intersection providing intermediate rectangular space for the IO2 pad 441.

In the aligned infrastructure of the double IO pad cell 208 of the IC 100, the VSSA strip 431 is aligned over the extent of both diodes B11 and B12, the IO1 pad 439 is aligned to be straddled between the diodes A11 and B11, and the IO2 pad 441 is aligned to be straddled between the diodes A12 and B12. Such overlap enables sufficient coupling of B11 between VSSA and the IO1 pad 439, of A11 between IO1 pad 439 and VDDA, of B12 between VSSA and the IO2 pad 441, and of A12 between IO2 pad 441 and VDDA. Also, the cathodes of A21 and A22 may be readily coupled to BOOST via the BOOST strips 425 and 437. It is noted that the alignment of VSSA strip 421 and VDDA strip 423 relative to the area 414 enables ready coupling of the secondary ESD circuits 114 and 124. The DVSS strip 419 at the very top makes it easy to connect to it from the core side. The DVSS strip 427 is aligned with the gap between the diodes A11 and A21 and is coupled to the collector guard rings of both diodes. In a similar manner, the DVSS strip 435 is aligned with the gap between the diodes A12 and A22 and is coupled to the collector guard rings of both diodes.

The double IO pad cell 208 contains ESD protection for two external analog signals interfaced via the IO1 and IO2 pins and corresponding IO1 and IO2 pads 439 and 441 of the IC 100. As shown in FIG. 4, the ESD elements are stacked on top of each other. The cell length of the double IO pad cell 208 is increased relative to the conventional IO pad cell 300, which improves the overall layout area efficiency because of the reduced area impact of the vertical cell guard rings. Because of the increased length, the primary ESD diodes A11, B11, B12, and A12 may be fabricated longer in the horizontal direction and relatively short in the vertical direction. This enables relatively short metal IO pads IO1 439 and IO2 441, leaving more bus metal available for the supply buses VDDA and VSSA. This also improves the effectiveness of the remote ESD clamps. The diodes metal straps are also shorter, reducing their ESD series resistance.

Figure 5:
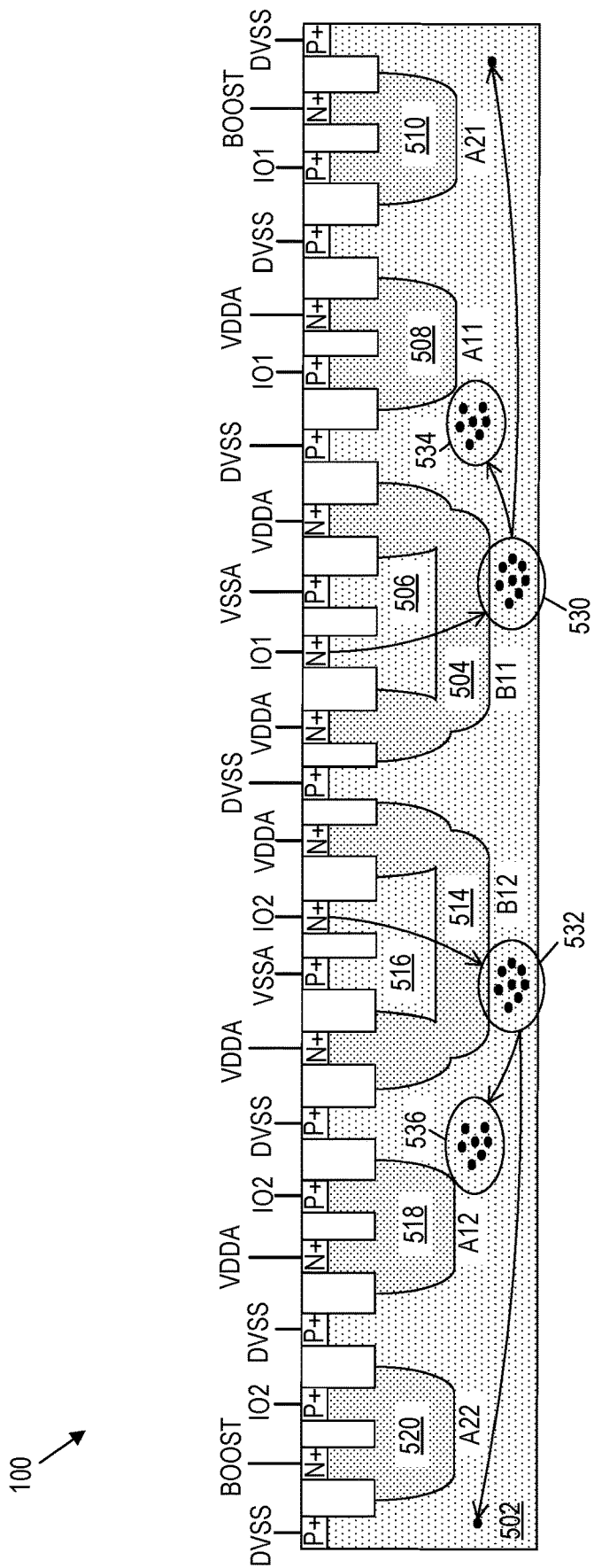
FIG. 5 is a cross-sectional side view of a portion of the IC of FIG. 2 illustrating more specific detail of the fabrication and the relative positioning of the ESD elements of the first and second primary ESD circuits of FIG. 1 according to one embodiment of the present disclosure.

FIG. 5 is a cross-sectional side view of a portion of the IC 100 illustrating more specific detail of the fabrication and the relative positioning of the ESD elements B11, A11, and A12 of the primary ESD circuit 112 of the ESD protection circuit 110, and ESD elements B12, A12, and A22 of the primary ESD circuit 122 of the ESD protection circuit 120 according to one embodiment of the present disclosure. The elements are formed within a P-type substrate 502. B11 is formed by a deep N-well 504 within the P-type substrate 502 that spans between a pair of N+ active regions both coupled to VDDA. An isolated P-well 506 is formed within the deep N-well 504 spanning between an N+ active region coupled to IO1 (referencing IO1 pad and pin) and a P+ active region coupled to VSSA. It is noted that the deep N-well 504 for B11 and a similar deep N-well 514 for B12 (described below) may actually be formed by regular N-well portions on the left and right sides with a deep N-well at the bottom portion that isolates the tub from the P-type substrate 502. A11 is formed adjacent to and to the right of B11 by an N-well 508 within the P-type substrate 502 spanning a P+ active region coupled to IO1 and an N+ active region coupled to VDDA. A12 is formed adjacent to and to the right of A11 by an N-well 510 within the P-type substrate 502 spanning a P+ active region coupled to IO1 and an N+ active region coupled to BOOST.

B12 is formed adjacent to and to the left of B11 by the deep N-well 514 within the P-type substrate 502 that spans between a pair of N+ active regions both coupled to VDDA. An isolated P-well 516 is formed within the deep N-well 514 spanning an N+ active region coupled to IO2 (referencing IO2 pad and pin) and a P+ active region coupled to VSSA. A12 is formed adjacent to and to the left of B12 by an N-well 518 within the P-type substrate 502 spanning a P+ active region coupled to IO2 and an N+ active region coupled to VDDA. A22 is formed adjacent to and to the left of A12 by an N-well 520 within the P-type substrate 502 spanning a P+ active region coupled to IO2 and an N+ active region coupled to BOOST. Multiple P+ active regions are formed in the P-type substrate 502 between each of the diodes, in which each of the intermediate P+ active regions is coupled to DVSS.

During an electrical stress event on an IO pad, electrons may be injected from the N+ active regions of the B11 and B12 diodes coupled to IO1 and IO2, respectively, to the P-type substrate 502 as shown at areas 530 and 532, respectively. As shown by areas 534 and 536, respectively, most of these injected electrons get collected by the N-wells 508 and 518 of the diodes A11 and A12, respectively. In this manner, since B11 and B12 are both sandwiched between A11 and A12, the A11 and A12 diodes provide effective wide additional collector guard bands for the B11 and B12 diodes and thereby reduce latch-up risk in nearby victim structures, both towards the top and bottom sides of the IO cell. This is especially important for so-called "Area IO Placement" where an IO segment is placed in the chip core area. In an Area IO Placement, the IO pad cell could face victim structures (e.g. Sea-of-Gate areas) on either side.

It is noted that the embodiments are illustrated herein using a boosted rail clamp scheme using the BOOST rail 106 developing BOOST. The embodiments could alternatively be applied to a non-boosted rail clamp scheme in which the boost diodes A21 and A22 and the BOOST rail 106 are removed. Without the boosted rail clamp scheme, the trigger circuit of the ESD rail clamp is powered by VDDA instead of BOOST.

Figure 6:
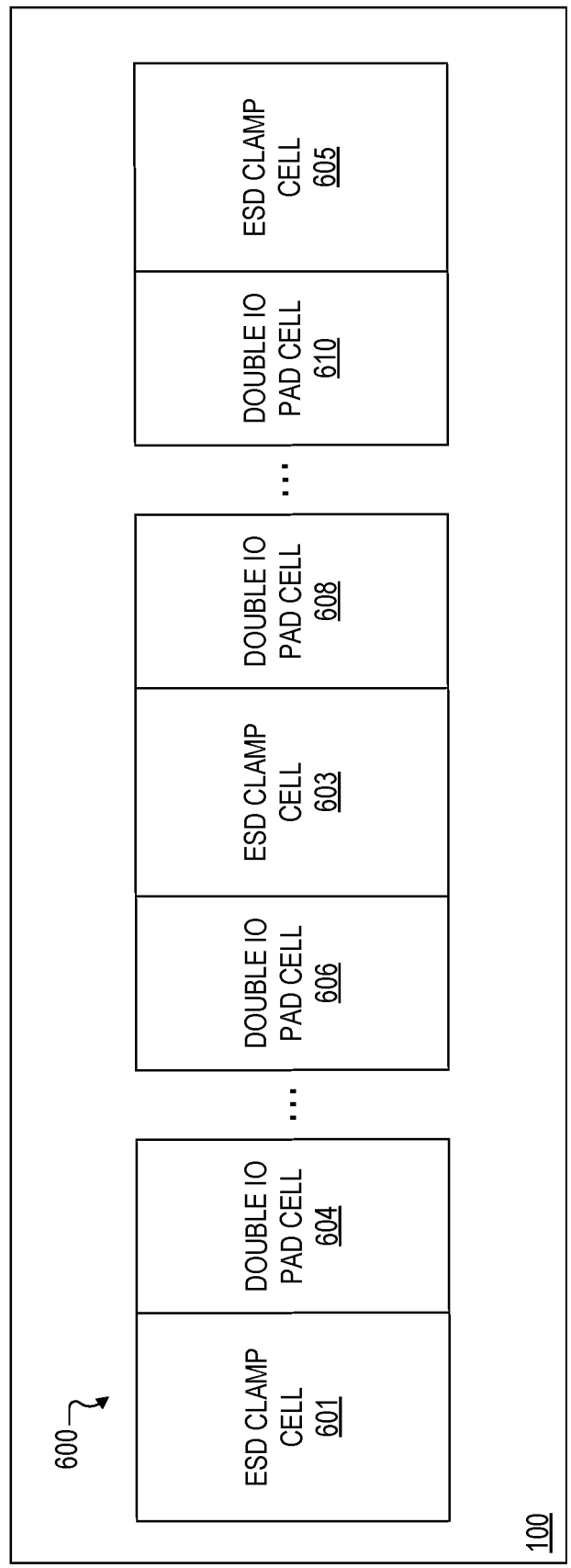
FIG. 6 is a simplified block diagram of a pad segment implemented on the IC of FIG. 2 including multiple ESD clamps distributed among multiple double IO pad cells implemented according to an embodiment of the present disclosure.

FIG. 6 is a simplified block diagram of a pad segment 600 implemented on the IC 100 including multiple ESD clamp cells 601, 603, 605, etc., distributed among multiple double IO pad cells implemented according to an embodiment of the present disclosure. The multiple double IO pad cells include a first string of IO pad cells from a first double IO pad cell 604 to a last double IO pad cell 606 and a second string of IO pad cells from a first double IO pad cell 608 to a last double IO pad cell 610. Although each string of IO pad cells includes multiple double IO pad cells, it is understood that any string may include just one double IO pad cell. The ESD clamp cells are distributed among multiple double IO pad cells including a first ESD clamp cell 601 adjacent to the double IO pad cell 604, a second ESD clamp cell 603 positioned between the double IO pad cells 606 and 608, a third ESD clamps 605 adjacent to the double IO pad cell 610, and so on. It is noted that this cell abutment scheme essentially provides for continuous buses along the pad bank.

Each of the double IO pad cells 604, 606, 608, and 610 is implemented in substantially the same manner as the double IO pad cell 208 for providing ESD protection for two analog signals between either the VDDA rail 102 or the VSSA rail 104 as previously described. Each of the ESD clamp cells 601, 603, 605, etc., provides rail-to-rail ESD protection between the VDDA and VSSA rails 102 and 104. Each ESD clamp cell may include ESD protection circuitry incorporating any type of ESD components, such as including B2B diodes, Zener diodes, MOS transistor clamps, etc.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A double input-output (IO) pad cell formed on an integrated circuit (IC), the double IO pad cell comprising:
a busing frame having a specified length and specified height formed on a busing metal layer, wherein the busing frame comprises a first IO pad for a first IO signal, a second IO pad for a second IO signal, a supply voltage rail, and a ground voltage rail; and
a component frame having the specified length and the specified height integrated on a component layer aligned with the busing frame, the component frame comprising:
first primary electrostatic discharge (ESD) circuitry comprising a first diode coupled between the first IO pad and the supply voltage rail and a second diode coupled between the first IO pad and the ground voltage rail; and
second primary ESD circuitry comprising a third diode coupled between the second IO pad and the supply voltage rail and a fourth diode coupled between the second IO pad and the ground voltage rail;
wherein the second and fourth diodes are integrated adjacent each other sandwiched between the first and third diodes, wherein the first and second diodes are aligned with the first IO pad, and wherein the third and fourth diodes are aligned with the second IO pad.

2. The double IO pad cell of claim 1, wherein:
the second and fourth diodes each comprise a deep N-well formed within a P-type substrate and an isolated P-well formed within the deep N-well; and
wherein the first and third diodes each comprise an N-well formed within the P-type substrate.

3. The double IO pad cell of claim 1, wherein the first, second, third, and fourth diodes are integrated on the component frame adjacent each other with each having a length that substantially extends over the specified length of the component frame, and wherein the third and fourth diodes are integrated within a first area at a first end along the specified height of the component frame, and wherein the first and second diodes are integrated within a second area adjacent the first area along the specified height of the component frame.

4. The double IO pad cell of claim 3, further comprising first secondary ESD circuitry and second secondary ESD circuitry integrated within a third area at a second end along the specified height of the component frame.

5. The double IO pad cell of claim 1, wherein the first and third diodes are positioned to act as collector guard bands for the second and fourth diodes.

6. The double IO pad cell of claim 1, further comprising:
the busing frame including a boost voltage rail; and
a fifth diode coupled between the first IO pad and the boost voltage rail and a sixth diode coupled between the second IO pad and the boost voltage rail.

7. The double IO pad cell of claim 1, wherein:
the first IO pad and the second IO pad of the busing frame each have a first side separated by a ground conductive strip coupled to the ground voltage rail; and
the busing frame including a first supply conductive strip positioned at a second side of the first IO pad and a second supply conductive strip positioned at a second side of the second IO pad, wherein the first and second supply conductive strips are coupled to the supply voltage rail.

8. The double IO pad cell of claim 1, wherein the first IO pad is coupled to a first IO pin of the IC for handling a first external analog signal, and wherein the second IO pad is coupled to a second IO pin of the IC for handling a second external analog signal.

9. The double IO pad cell of claim 1, wherein the first IO pad is aligned between the first diode and the second diode of the first primary ESD circuitry and wherein the second IO pad is aligned between the third diode and the fourth diode of the second primary ESD circuitry.

10. The double IO pad cell of claim 1, wherein the first, second, third, and fourth diodes each have a length substantially extending the specified length of the component frame and a shortened height for stacking within the specified height of the component frame.

11. An integrated circuit, comprising:
a plurality of layers including a busing metal layer and a component layer;
a plurality of conductive vias interposed between the plurality of layers;
first and second pins for interfacing first and second external analog signals, respectively; and
a double input-output (IO) pad cell, comprising:
  a busing frame having a specified length and specified height formed on the busing metal layer, wherein the busing frame comprises a first IO pad coupled to the first pin, a second IO pad coupled to the second pin, a supply voltage rail, and a ground voltage rail; and
  a component frame having the specified length and the specified height integrated on the component layer aligned with the busing frame, the component frame comprising:
    first primary electrostatic discharge (ESD) circuitry comprising a first diode coupled between the first IO pad and the supply voltage rail and a second diode coupled between the first IO pad and the ground voltage rail; and
    second primary ESD circuitry comprising a third diode coupled between the second IO pad and the supply voltage rail and a fourth diode coupled between the second IO pad and the ground voltage rail;
    wherein the second and fourth diodes are integrated adjacent each other sandwiched between the first and third diodes, wherein the first and second diodes are aligned with the first IO pad, and wherein the third and fourth diodes are aligned with the second IO pad.

12. The integrated circuit of claim 11, wherein:
the second and fourth diodes each comprise a deep N-well formed within a P-type substrate and an isolated P-well formed within the deep N-well; and
wherein the first and third diodes each comprise an N-well formed within the P-type substrate.

13. The integrated circuit of claim 11, wherein the first, second, third, and fourth diodes are integrated on the component frame adjacent each other with each having a length that substantially extends the specified length of the component frame, and wherein the third and fourth diodes are integrated within a first area at a first end along the specified height of the component frame, and wherein the first and second diodes are integrated within a second area adjacent the first area along the specified height of the component frame.

14. The integrated circuit of claim 13, further comprising first secondary ESD circuitry and second secondary ESD circuitry integrated within a third area at a second end along the specified height of the component frame.

15. The integrated circuit of claim 11, wherein the first and third diodes are positioned to act as collector guard bands for the second and fourth diodes.

16. The integrated circuit of claim 11, further comprising:
the busing frame including a boost voltage rail; and
a fifth diode coupled between the first IO pad and the boost voltage rail and a sixth diode coupled between the second IO pad and the boost voltage rail.

17. The integrated circuit of claim 11, wherein:
the first IO pad and the second IO pad of the busing frame each have a first side separated by a ground conductive strip coupled to the ground voltage rail; and
the busing frame including a first supply conductive strip positioned at a second side of the first IO pad and a second supply conductive strip positioned at a second side of the second IO pad, wherein the first and second supply conductive strips are coupled to the supply voltage rail.

18. The integrated circuit of claim 11, wherein the first IO pad is coupled to a first IO pin of the IC for handling a first external analog signal, and wherein the second IO pad is coupled to a second IO pin of the IC for handling a second external analog signal.

19. The integrated circuit of claim 11, wherein the first IO pad is aligned between the first diode and the second diode of the first primary ESD circuitry and wherein the second IO pad is aligned between the third diode and the fourth diode of the second primary ESD circuitry.

20. The integrated circuit of claim 11, wherein the first, second, third, and fourth diodes each have a length substantially extending the specified length of the component frame and a shortened height for stacking within the specified height of the component frame.

* * * * *